US009842678B2

(12) United States Patent
Suzuki et al.

(10) Patent No.: US 9,842,678 B2
(45) Date of Patent: Dec. 12, 2017

(54) MNBI MAGNETIC MATERIAL

(71) Applicants: The Board of Trustees of the University of Alabama, Tuscaloosa, AL (US); TDK Corporation, Shibaura, Tokyo (JP)

(72) Inventors: Takao Suzuki, Tuscaloosa, AL (US); Patrick R. Leclair, Tuscaloosa, AL (US); Toshiya Hozumi, Northport, AL (US)

(73) Assignees: The Board of Trustees of The University of Alabama, Tuscaloosa, AL (US); TDK Corporation, Tokyo (JP)

( * ) Notice: Subject to any disclaimer, the term of this patent is extended or adjusted under 35 U.S.C. 154(b) by 0 days.

(21) Appl. No.: 15/033,435

(22) PCT Filed: Jan. 16, 2014

(86) PCT No.: PCT/US2014/011943

§ 371 (c)(1),
(2) Date: Apr. 29, 2016

(87) PCT Pub. No.: WO2015/065507

PCT Pub. Date: May 7, 2015

(65) Prior Publication Data

US 2016/0276073 A1 Sep. 22, 2016

Related U.S. Application Data

(60) Provisional application No. 61/898,509, filed on Nov. 1, 2013.

(51) Int. Cl.

| | |
|---|---|
| ***H01F 1/047*** | (2006.01) |
| ***H01F 41/18*** | (2006.01) |
| ***C23C 14/18*** | (2006.01) |

(52) U.S. Cl.

CPC .......... *H01F 1/047* (2013.01); *C23C 14/185* (2013.01); *H01F 41/18* (2013.01)

(58) Field of Classification Search

None

See application file for complete search history.

(56) References Cited

U.S. PATENT DOCUMENTS

| | | | | |
|---|---|---|---|---|
| 4,563,396 A * | 1/1986 | Fukuda | G11B 5/64 | 360/134 |
| 4,645,722 A * | 2/1987 | Katayama | G03G 5/16 | 360/131 |
| 5,660,929 A * | 8/1997 | Suzuki | G11B 5/64 | 360/131 |
| 5,750,044 A * | 5/1998 | Yoneyama | H01F 1/0596 | 148/301 |
| 8,520,433 B1 * | 8/2013 | Kato | G11C 11/161 | 365/148 |
| 2011/0186948 A1 | 8/2011 | Pochet et al. | | |
| 2012/0141837 A1 * | 6/2012 | Kurt | G11B 5/65 | 428/832 |
| 2013/0162089 A1 * | 6/2013 | Komuro | H02K 1/02 | 310/156.01 |
| 2013/0236720 A1 | 9/2013 | Heiman et al. | | |
| 2017/0117074 A1 * | 4/2017 | Suzuki | H01F 1/06 | |

FOREIGN PATENT DOCUMENTS

| | | |
|---|---|---|
| EP | 0125536 A2 | 11/1984 |
| JP | 11067511 A | 3/1999 |
| JP | 11135311 A | 5/1999 |
| JP | 2006049706 A | 2/2006 |

OTHER PUBLICATIONS

Zhang et al. (Posters A: Thin Films, 2014 conference paper).*

International Search Report and Written Opinion issued in related International Application No. PCT/2014/011943 dated Jul. 30, 2014.

Varvaro G and Casoli F, eds. Ultrahigh-Density Magnetic Recording: Storage Materials and Media Designs. Boca Raton, FL: CRC Press, Taylor & Francis Group, 2016, p. 397.

Japanese Office Action issued in corresponding Japanese Application No. 2016-527366, dated Sep. 22, 2017.

* cited by examiner

*Primary Examiner* — Kevin Bernatz

(74) *Attorney, Agent, or Firm* — Meunier Carlin & Curfman LLC

(57) ABSTRACT

A binary, ternary, quaternary, or quinary Mn—X magnetic material (X represents at least one element selected from Al, Bi, Ga, and Rh) has a thickness of 100 nm or less and exhibits a uniaxial magnetic anisotropy constant of $10^7$ erg/cc or higher and a coercive force of 15 kOe or higher in the temperature range of 0° C. or more and 200° C. or less, and a room-temperature saturation magnetization of 400 emu/cc or higher.

5 Claims, 6 Drawing Sheets

MNBI MAGNETIC MATERIAL

STATEMENT OF GOVERNMENT SUPPORT

This invention was made with Government Support under Grant No. CMMI-1229049 awarded by the National Science Foundation. The Government has certain rights in the invention.

FIELD

The present invention generally relates to magnetic materials. In particular, it relates to a manganese (Mn)-based magnetic material having improved saturation magnetization and coercive force.

BACKGROUND

Magnetic materials are used in devices of a wide variety of fields, such as magnetic recording media, tunneling magneto-resistive elements, magneto-resistive random access memories, and microelectromechanical systems (MEMS). In recent years, these devices have been required to have higher performance and thus magnetic material are required to exhibit improved magnetic properties.

Magnetic materials containing rare earth elements are known to exhibit large magnetic anisotropy in general. An example of a high-performance magnetic material is a magnetic material that contains a neodymium compound ($Nd_2Fe_{14}B$ compound) (refer to Japanese Unexamined Patent Application Publication No. 2009-70857).

SUMMARY

Rare earth elements are costly and the supply thereof tends to be unstable. Thus, it is desirable to decrease the amounts of the rare earth elements used as much as possible. The present invention provides a high-performance magnetic material in which rare earth elements are not used.

An aspect of the present invention provides a binary, ternary, quaternary, or quinary Mn—X magnetic material (X represents at least one element selected from Al, Bi, Ga, and Rh) having a thickness of 100 nm or less and exhibiting a uniaxial magnetic anisotropy constant of $10^7$ erg/cc or higher and a coercive force of 15 kOe or higher in the temperature range of 0° C. or more and 200° C. or less, and a room-temperature saturation magnetization of 400 emu/cc or higher.

The magnetic material may be formed on an amorphous substrate. The magnetic material is preferably formed by a sputtering method in an argon atmosphere. The magnetic material preferably has a maximum energy product of 6 MGOe or higher.

DETAILED DESCRIPTION

Figure 1:
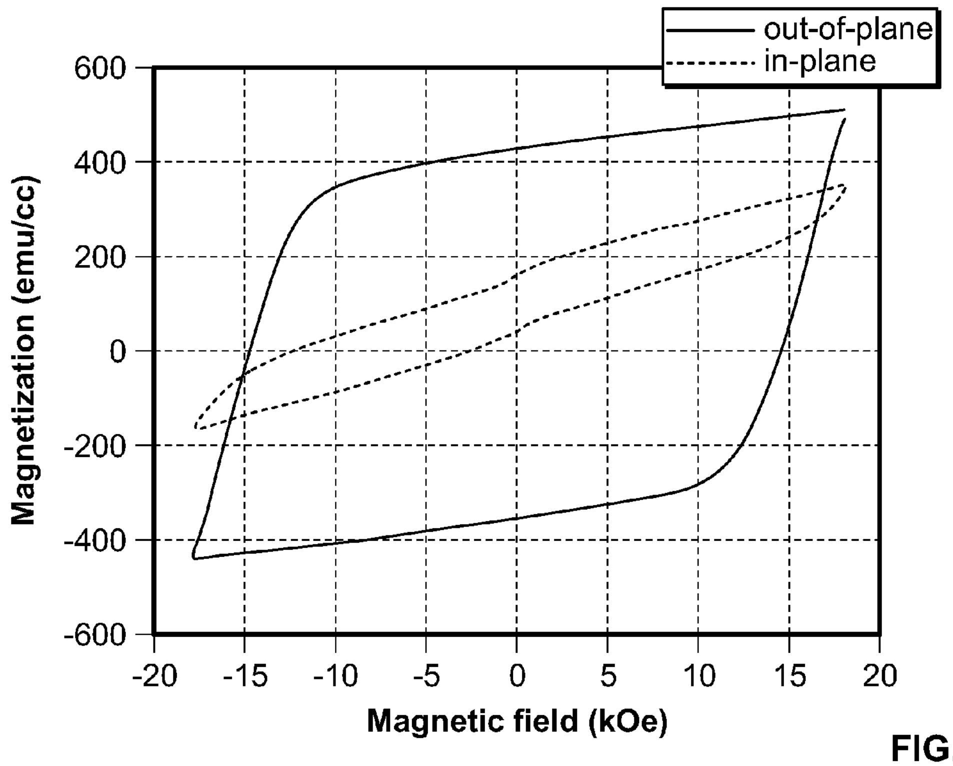
FIG. 1 shows the in-plane and out-of-plane magnetization (emu/cc) in relation to the magnetic field (kOe) for the film of Example 1.
Figure 2:
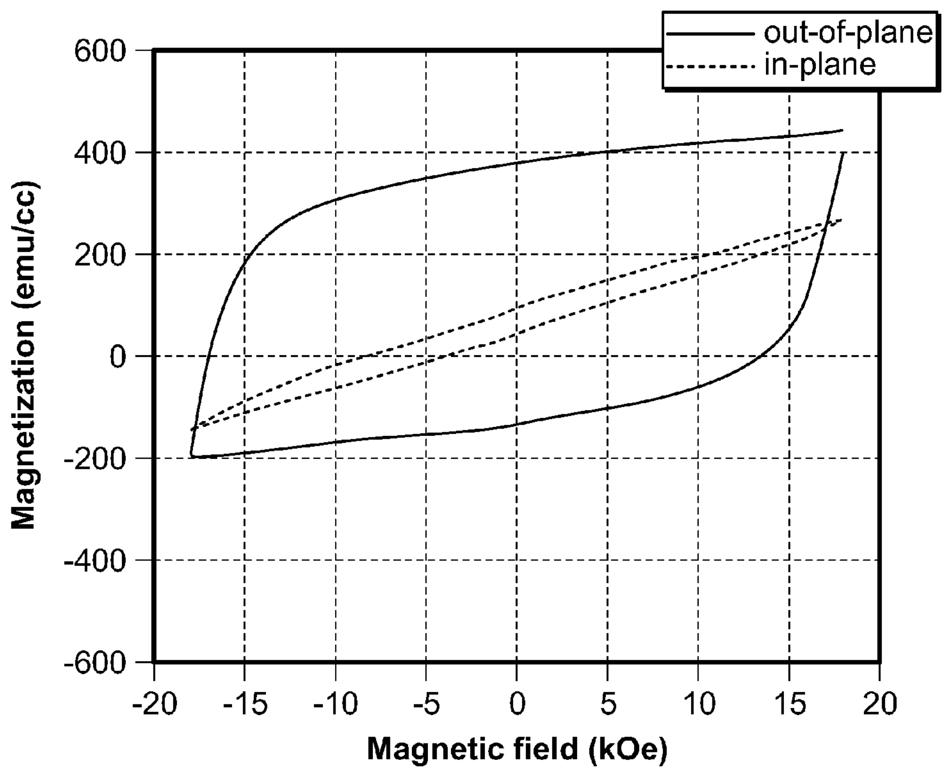
FIG. 2 shows the in-plane and out-of-plane magnetization (emu/cc) in relation to the magnetic field (kOe) for the film of Example 2.
Figure 3:
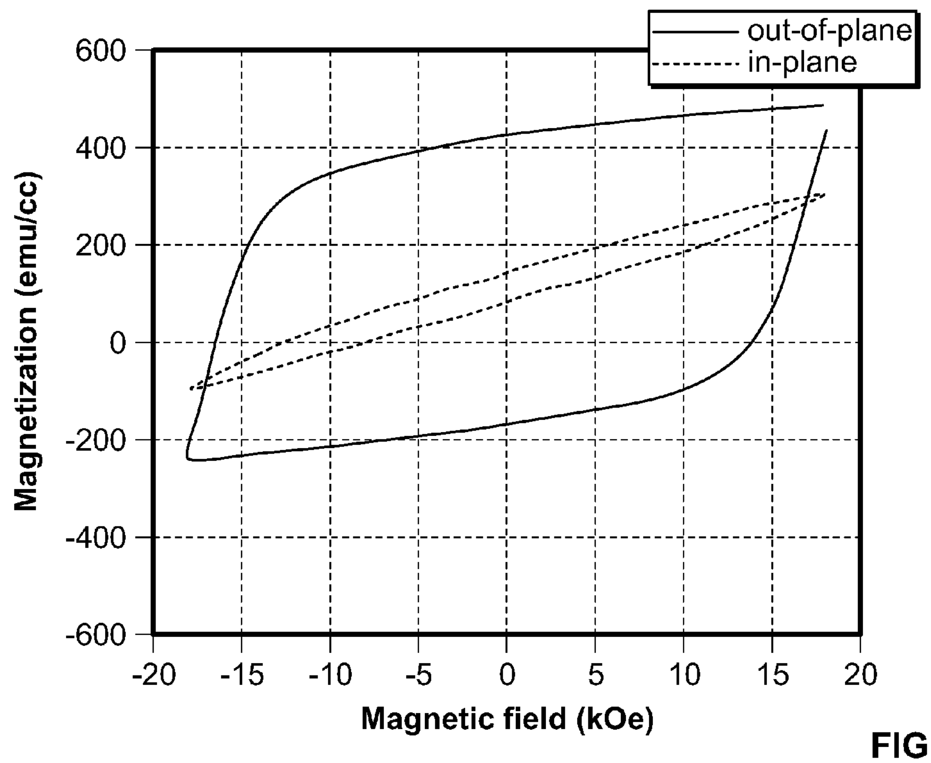
FIG. 3 shows the in-plane and out-of-plane magnetization (emu/cc) in relation to the magnetic field (kOe) for the film of Example 3.
Figure 4:
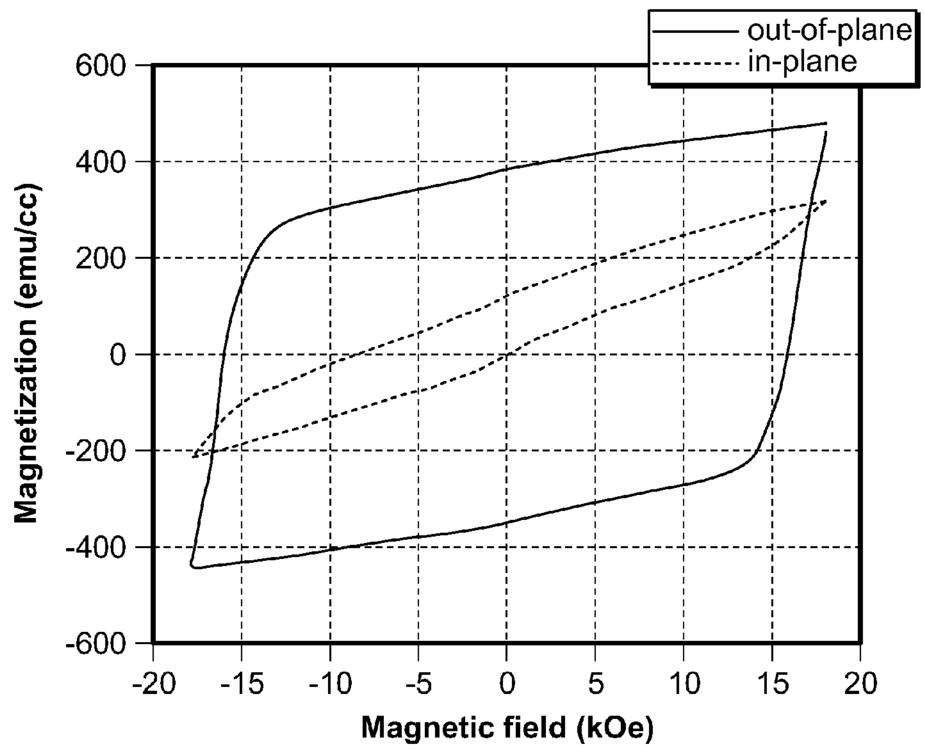
FIG. 4 shows the in-plane and out-of-plane magnetization (emu/cc) in relation to the magnetic field (kOe) for the film of Example 4.
Figure 5:
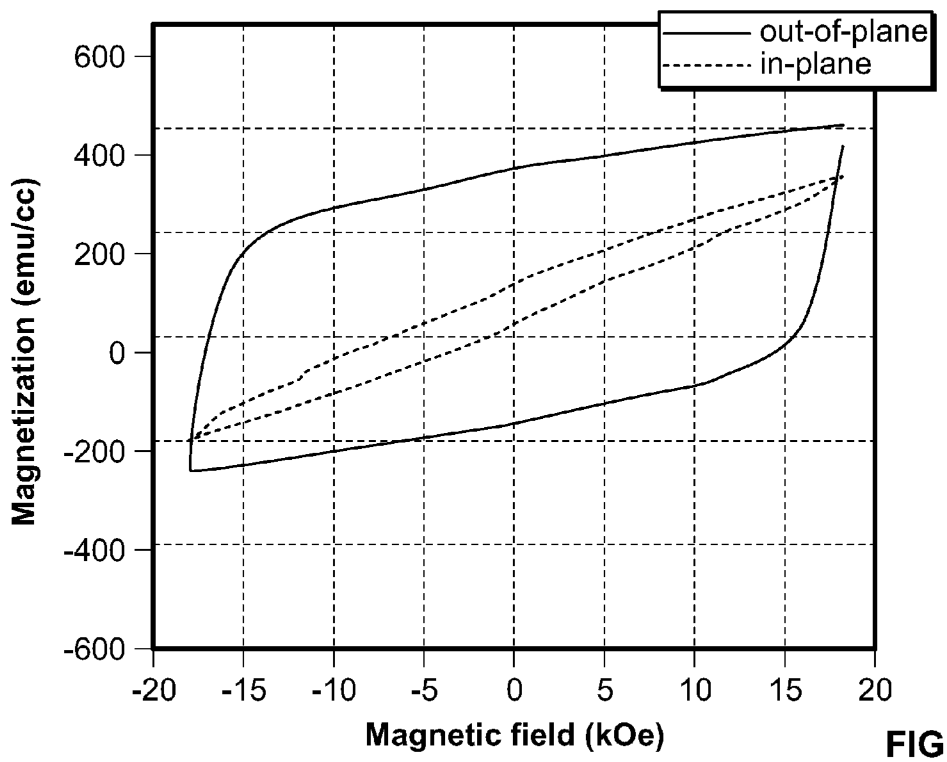
FIG. 5 shows the in-plane and out-of-plane magnetization (emu/cc) in relation to the magnetic field (kOe) for the film of Example 5.
Figure 6:
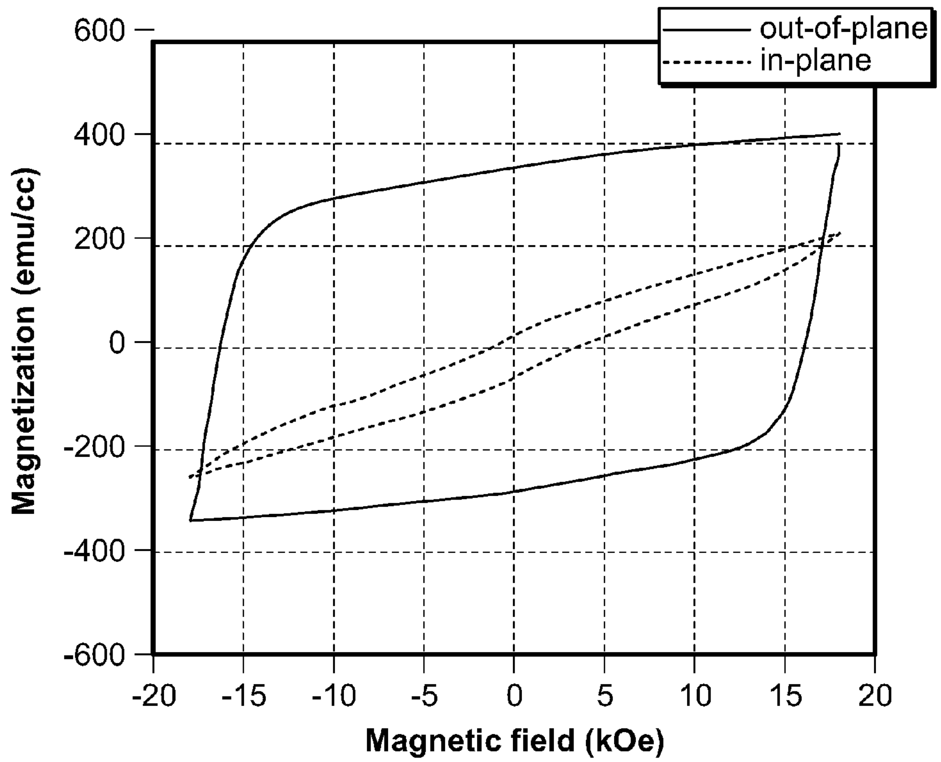
FIG. 6 shows the in-plane and out-of-plane magnetization (emu/cc) in relation to the magnetic field (kOe) for the film of Example 6.
Figure 7:
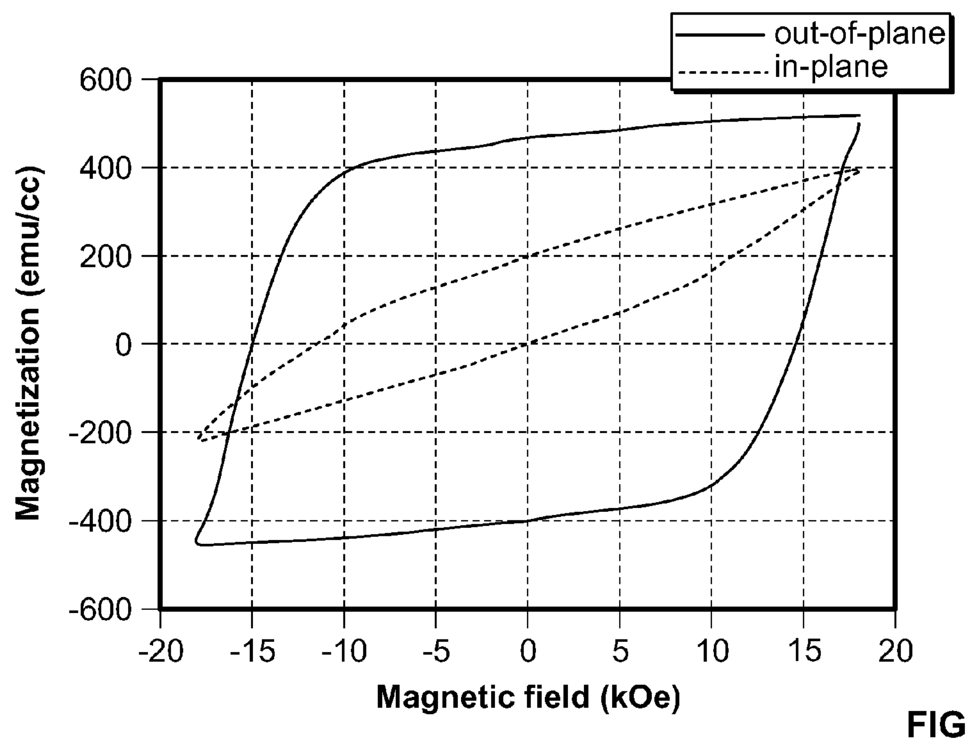
FIG. 7 shows the in-plane and out-of-plane magnetization (emu/cc) in relation to the magnetic field (kOe) for the film of Example 7.
Figure 8:
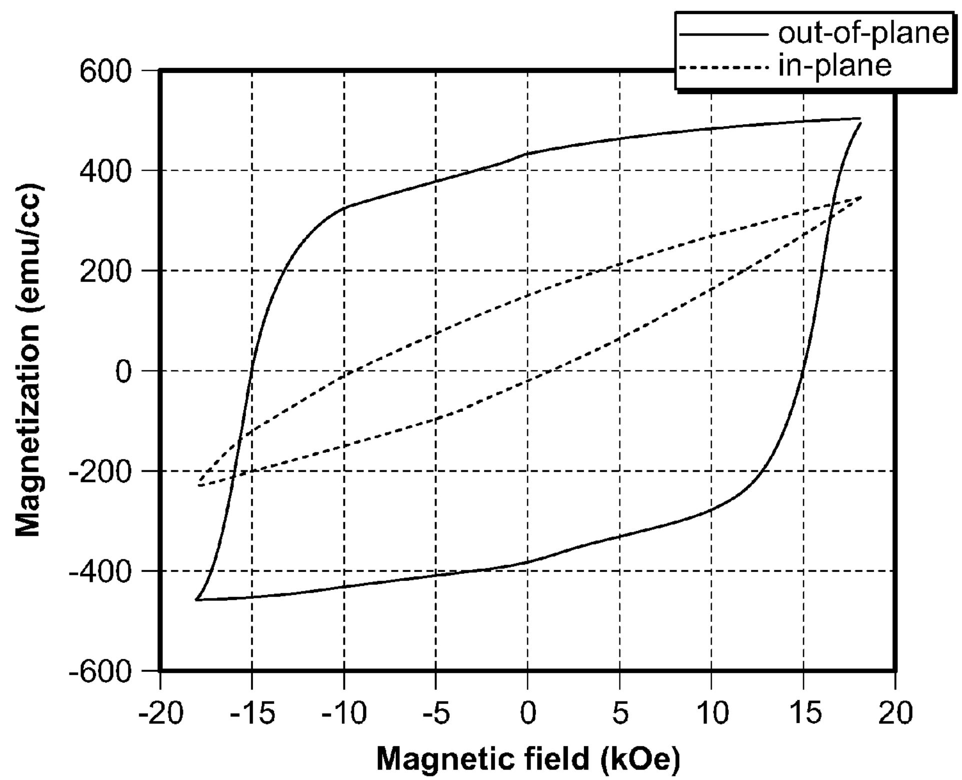
FIG. 8 shows the in-plane and out-of-plane magnetization (emu/cc) in relation to the magnetic field (kOe) for the film of Example 8.
Figure 9:
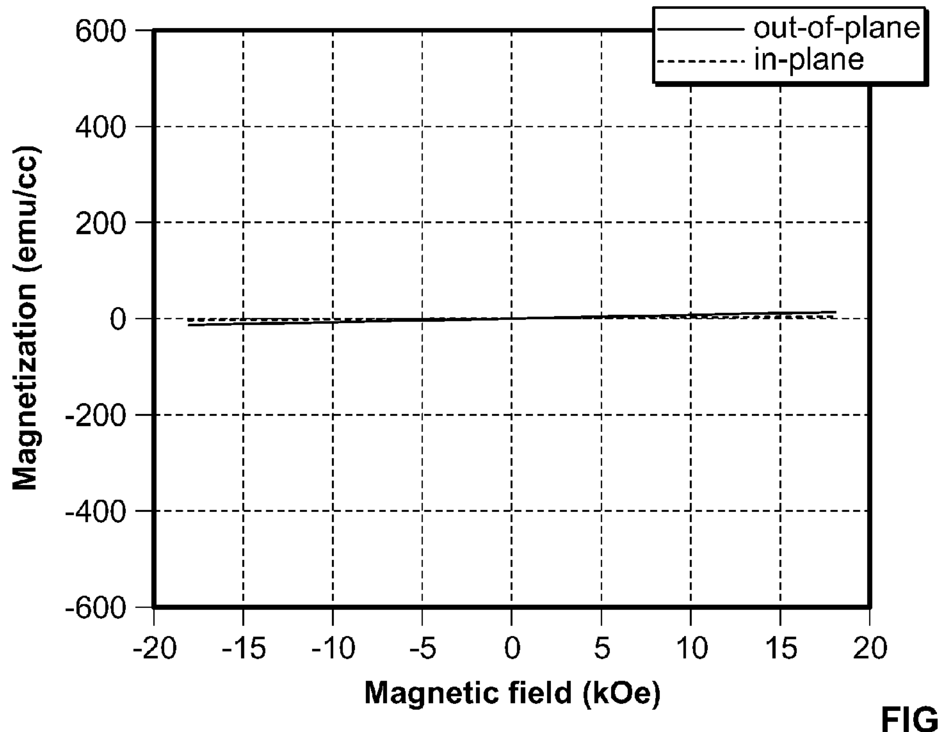
FIG. 9 shows the in-plane and out-of-plane magnetization (emu/cc) in relation to the magnetic field (kOe) for the film of Comparative Example 1.
Figure 10:
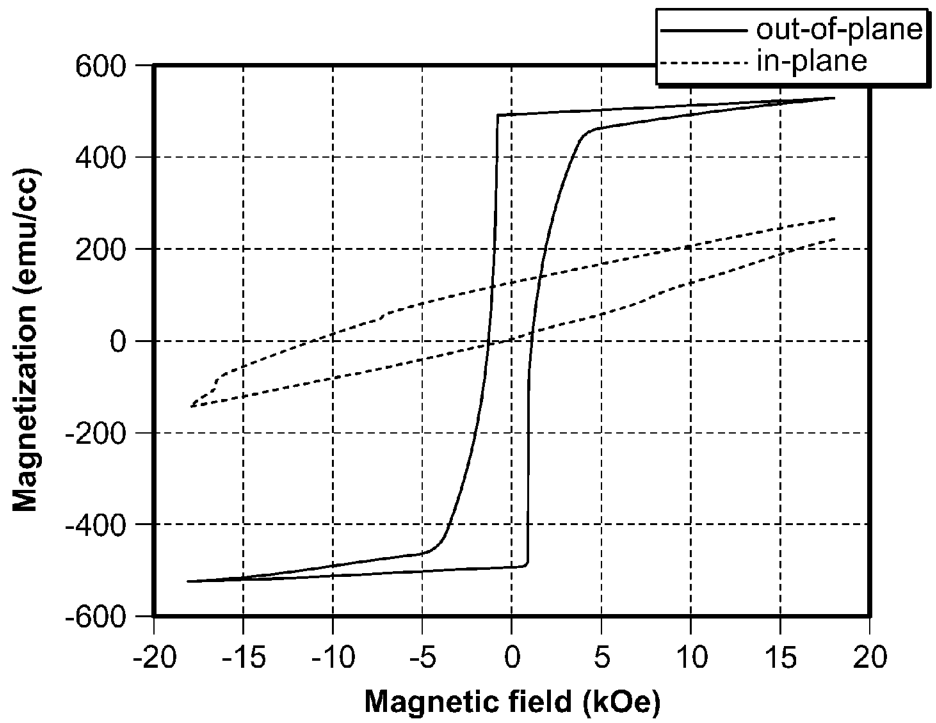
FIG. 10 shows the in-plane and out-of-plane magnetization (emu/cc) in relation to the magnetic field (kOe) for the film of Comparative Example 2.
Figure 11:
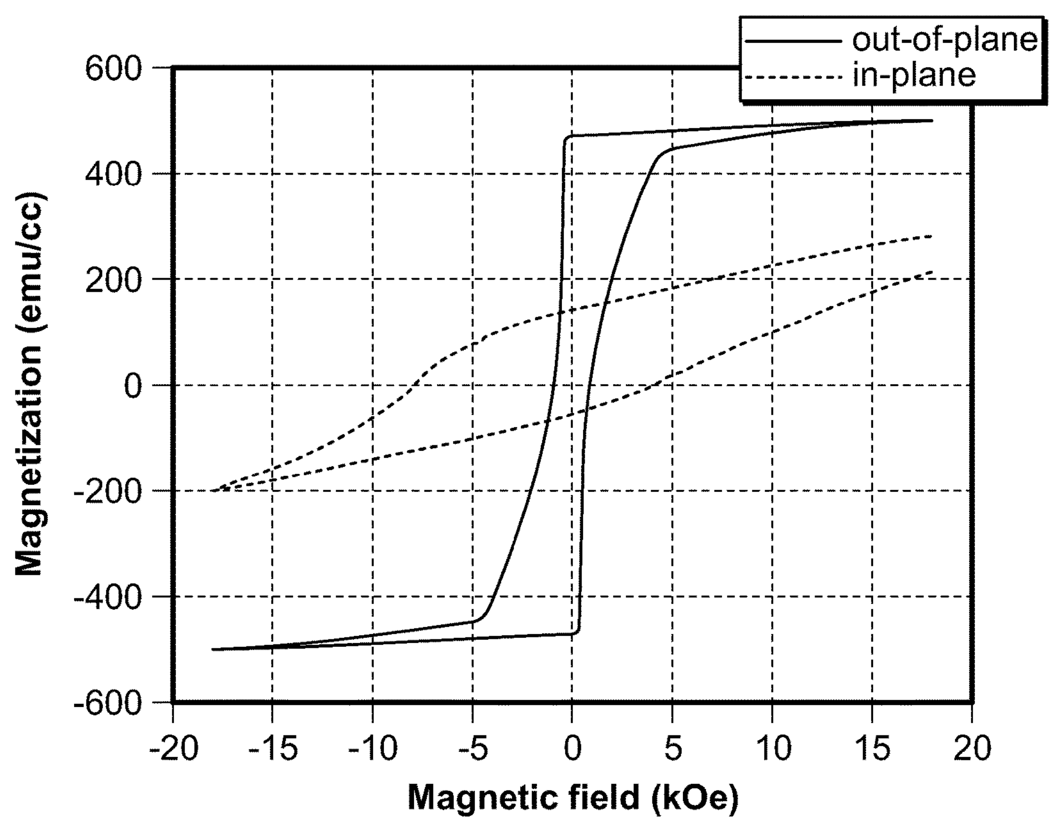
FIG. 11 shows the in-plane and out-of-plane magnetization (emu/cc) in relation to the magnetic field (kOe) for the film of Comparative Example 3.

The present invention will now be described in detail. It should be understood that the scope of the present invention is not limited to the following examples for implementing the invention (hereinafter such examples are referred to as "embodiments"). It is intended that the constitutional features of the present inventions are not limited to those of the embodiments described below and include those features easily conceivable by skilled persons, those features which are substantially identical, and those features that are equivalent.

An example of the magnetic material that does not contain rare earth elements is a manganese (Mn)-based material. Manganese is abundant compared to other rare earth elements and advantageous over other rare earth elements in terms of raw material cost and supply. Mn—Al, Mn—Bi, Mn—Ga, and Mn—Rh are known to display a ferromagnetic property at room temperature. Mn—Al, Mn—Bi, and Mn—Ga exhibit large magnetic anisotropy despite not containing rare earth elements. Thus, Mn-based materials are prospective candidates for materials for magnets. Examples of favorable combinations of elements for a Mn-based material include binary compounds such as Mn—Al, Mn—Bi, Mn—Ga, and Mn—Rh, ternary compounds such as Mn—Al—Bi, Mn—Al—Ga, Mn—Al—Rh, Mn—Bi—Ga, Mn—Bi—Rh, and Mn—Ga—Rh, quaternary compounds such as Mn—Al—Bi—Ga, Mn—Al—Bi—Rh, Mn—Al—Ga—Rh, and Mn—Bi—Ga—Rh, and quinary compounds such as Mn—Al—Bi—Ga—Rh. The magnetic material according to an embodiment of the present invention may contain an element or elements other than those described above.

In the temperature range of 0° C. or higher and 200° C. or lower, the magnetic material exhibits a uniaxial magnetic anisotropy constant of $10^7$ erg/cc or higher and a coercive force of 15 kOe or higher. The magnetic material also exhibits a room-temperature saturation magnetization of 400 emu/cc or higher. Thus, the magnetic material can be used in place of existing magnetic materials that contain rare earth elements. Considering that magnetic materials having enhanced performance are in demand, the maximum energy product is preferably 6 MGOe or higher.

The thickness of the magnetic material is preferably 100 nm or less. At a thickness exceeding 100 nm, coercive force is decreased and magnetic properties are degraded.

Method for Producing Magnetic Material

The magnetic material according to an embodiment of the present invention is prepared as follows. First, a target material is prepared as the raw material. A Mn—X alloy target material having a desired composition is used as the target material. The composition of a film prepared by sputtering may deviate from the composition of the target material since the sputtering rates of the respective elements differ and thus the composition of the target material is preferably adjusted. Alternatively, single-element targets of Mn and X may be prepared and sputtering may be conducted at appropriate rates. Alternatively, an alloy target and a single-element target may be used in combination and sputtering may be conducted at appropriate rates. Since oxygen degrades the coercive force of the magnetic material, it is preferable to remove as much oxygen as possible. The oxygen content in the target material is preferably decreased as much as possible.

The target material undergoes oxidation from its surface during storage. Accordingly, prior to using the target material, the target material is preferably thoroughly sputtered so as to expose a clean surface.

The substrate on which a film is to be formed by sputtering may be composed of any of various metals, glasses, silicon, ceramics, etc. From the viewpoint of the production cost, a low-cost amorphous substrate such as a glass substrate is preferable.

The vacuum chamber of a film deposition system used to conduct sputtering is preferably evacuated to $10^{-6}$ Torr or lower and more preferably $10^{-8}$ Torr or lower since it is desirable to eliminate impurity elements such as oxygen as much as possible. Before using the target material, the target material needs to be thoroughly sputtered to expose a clean surface. Accordingly, the film deposition system preferably has a shielding mechanism operable in a vacuum state and located between the substrate and the target material. The sputtering method is preferably a magnetron sputtering method. In order to prevent generation of impurities resulting from the reaction with the magnetic material, argon is used as an atmosphere gas. The sputtering power source may be DC or RF and can appropriately be selected in accordance with the target material.

A film is formed by using the target material and the substrate described above. Examples of the film forming method include a simultaneous sputtering method in which a film is formed by using two or more targets simultaneously and a sequential sputtering method in which the targets are used one by one to deposit a multilayered film. The thickness of the magnetic material is preferably 100 nm or less.

The thickness of the magnetic material can be set to a desired thickness by adjusting the sputtering power, time, and argon atmosphere pressure. In order to adjust the thickness, the film deposition rate needs to be measured in advance. The film deposition rate can be measured by determining the thickness of a film formed in a particular length of time. A contact step-profiling method, X-ray reflectometry, ellipsometry, or the like is usually employed as a measurement method. It is also possible to install a quartz thickness monitor in the film deposition system.

During sputtering, the substrate is maintained at room temperature. After a film is formed, annealing is conducted to crystallize the film. Alternatively, the substrate may be heated during sputtering so that the film can be crystallized as it is deposited. The substrate is more preferably heated in vacuum or an inert gas atmosphere to suppress oxidation as much as possible.

A protective film composed of Cr, Mo, Ru, Ta, or the like may be formed on the Mn—X magnetic material to suppress oxidation of the Mn—X magnetic material. The protective film is formed after completion of deposition of the Mn—X magnetic material and before annealing. Alternatively, the protective film may be formed after annealing.

EXAMPLES

The present invention will now be described in more detail through Examples and Comparative Examples which do not limit the scope of the present invention.

A Mn single-element target and a Bi single-element target were used as the target materials. An amorphous quartz glass substrate was used as a substrate on which deposition was to be performed.

A system capable of forming a vacuum of $10^{-8}$ Torr or lower and has two or more sputtering mechanisms in one chamber was used as the film deposition system. The target materials described above and a Ru target material for forming a protective film were loaded into the film deposition system. Sputtering was conducted in an argon atmosphere by employing a magnetron sputtering method and a DC power source. The power of the DC power source and the deposition time were adjusted in accordance with the intended structure of the sample.

The power of the DC power source and the argon atmosphere pressure were adjusted so that the Mn deposition rate was 0.02 nm/s and the Bi deposition rate was 0.07 nm/s. Films were formed by a sequential sputtering method in which the target materials are sputtered one by one.

After a MnBi multilayered film was deposited, the multilayered film was annealed in a vacuum to form a crystalline MnBi film. The MnBi film was then cooled to room temperature in a vacuum and a Ru film was deposited thereon as a protective film. The samples prepared and the magnetic properties of the samples are detailed in Table below.

The magnetic properties of the samples were measured with an alternating gradient magnetometer (AGM) by applying an external magnetic field in a direction perpendicular to the film surface.

TABLE

| | X | Thickness (nm) | Annealing temperature (° C.) | Coercive force* (kOe) | Magnetization** (emu/cc) | FIG. |
|---|---|---|---|---|---|---|
| Example 1 | Bi | 20.8 | 550 | 15.0 | 516 | 1 |
| Example 2 | Bi | 26.0 | 550 | 17.0 | 441 | 2 |
| Example 3 | Bi | 36.4 | 550 | 16.5 | 497 | 3 |
| Example 4 | Bi | 48.0 | 500 | 15.9 | 481 | 4 |
| Example 5 | Bi | 50.0 | 550 | 16.9 | 405 | 5 |
| Example 6 | Bi | 52.0 | 500 | 16.4 | 415 | 6 |
| Example 7 | Bi | 52.0 | 550 | 15.0 | 521 | 7 |
| Example 8 | Bi | 78.0 | 550 | 15.0 | 506 | 8 |
| Comparative Example 1 | Bi | 52.0 | as made | 0 | 14 | 9 |
| Comparative Example 2 | Bi | 104.0 | 550 | 1.26 | 530 | 10 |
| Comparative Example 3 | Bi | 156.0 | 550 | 0.96 | 503 | 11 |

*The value of coercive force is the one obtained with a maximum field of 18 kOe.

**Magnetization value obtained at H = 18 kOe.

Comparison of Examples and Comparative Examples shows that high magnetic properties are obtained by conducting annealing after deposition of the MnBi multilayered film.

It was also found that a magnetic thin film having a high coercive force can be fabricated by adjusting the thickness to 100 nm or less.

What is claimed is:

1. A binary Mn—Bi magnetic material having a thickness of 100 nm or less and exhibiting a uniaxial magnetic anisotropy constant of $10^7$ erg/cc or higher and a coercive force of 15 kOe or higher in the temperature range of 0° C. or more and 200° C. or less, and a room-temperature saturation magnetization of 400 emu/cc or higher.

2. The magnetic material according to claim 1, wherein the magnetic material is formed on an amorphous substrate.

3. The magnetic material according to claim 1, wherein the magnetic material is formed by a sputtering method in an argon atmosphere.

4. The magnetic material according to claim 1, wherein the maximum energy product is 6 MGOe or higher.

5. The magnetic material according to claim 2, wherein the magnetic material is formed by a sputtering method in an argon atmosphere.

* * * * *